United States Patent
Cao et al.

(10) Patent No.: US 9,162,930 B2
(45) Date of Patent: Oct. 20, 2015

(54) PVD ALN FILM WITH OXYGEN DOPING FOR A LOW ETCH RATE HARDMASK FILM

(71) Applicant: Applied Materials, Inc., Santa Clara, CA (US)

(72) Inventors: Yong Cao, San Jose, CA (US); Kazuya Daito, Santa Clara, CA (US); Rajkumar Jakkaraju, Sunnyvale, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 55 days.

(21) Appl. No.: 13/867,606

(22) Filed: Apr. 22, 2013

(65) Prior Publication Data

US 2013/0296158 A1   Nov. 7, 2013

Related U.S. Application Data

(60) Provisional application No. 61/637,804, filed on Apr. 24, 2012.

(51) Int. Cl.
| | |
|---|---|
| *C23C 14/34* | (2006.01) |
| *C04B 35/581* | (2006.01) |
| *C23C 14/06* | (2006.01) |
| *H01L 21/033* | (2006.01) |
| *H01L 21/3213* | (2006.01) |
| *H01L 21/02* | (2006.01) |

(52) U.S. Cl.
CPC ............ *C04B 35/581* (2013.01); *C23C 14/0617* (2013.01); *H01L 21/0332* (2013.01); *H01L 21/32139* (2013.01); *H01L 21/0254* (2013.01); *H01L 21/02573* (2013.01); *H01L 21/02631* (2013.01)

(58) Field of Classification Search
CPC ............. C04B 35/581; C23C 14/0617; H01L 21/0332; H01L 21/32139; H01L 21/0254; H01L 21/02573; H01L 21/02631
USPC ............. 204/192.12, 192.15, 192.16, 192.22
See application file for complete search history.

(56) References Cited

U.S. PATENT DOCUMENTS

| | | |
|---|---|---|
| 6,534,809 B2 | 3/2003 | Moise et al. |
| 6,576,482 B1 * | 6/2003 | Aggarwal et al. ................ 438/3 |
| 6,927,651 B2 * | 8/2005 | Larson et al. ................ 333/189 |
| 7,045,406 B2 | 5/2006 | Huotari et al. |
| 7,521,269 B2 | 4/2009 | Song |
| 8,398,833 B2 | 3/2013 | Lee et al. |
| 8,422,272 B2 | 4/2013 | Inoue et al. |
| 8,440,510 B2 | 5/2013 | Yamazaki |
| 8,446,171 B2 | 5/2013 | Takahashi |
| 8,454,805 B2 | 6/2013 | Wilby |
| 8,461,007 B2 | 6/2013 | Yamazaki |
| 8,467,231 B2 | 6/2013 | Matsuzaki et al. |
| 8,467,232 B2 | 6/2013 | Matsuzaki et al. |

(Continued)

*Primary Examiner* — Rodney McDonald
(74) *Attorney, Agent, or Firm* — Patterson & Sheridan, LLP

(57) ABSTRACT

The present invention generally relates to a doped aluminum nitride hardmask and a method of making a doped aluminum nitride hardmask. By adding a small amount of dopant, such as oxygen, when forming the aluminum nitride hardmask, the wet etch rate of the hardmask can be significantly reduced. Additionally, due to the presence of the dopant, the grain size of the hardmask is reduced compared to a non-doped aluminum nitride hardmask. The reduced grain size leads to smoother features in the hardmask which leads to more precise etching of the underlying layer when utilizing the hardmask.

12 Claims, 2 Drawing Sheets

(56) References Cited

U.S. PATENT DOCUMENTS 8,488,394 B2 7/2013 Nagatsuka et al.
2003/0221620 A1* 12/2003 Yamazaki ............... 118/722
2011/0042200 A1* 2/2011 Wilby ............... 204/192.15

* cited by examiner

PVD ALN FILM WITH OXYGEN DOPING FOR A LOW ETCH RATE HARDMASK FILM

CROSS-REFERENCE TO RELATED APPLICATIONS

This application claims benefit of U.S. Provisional Patent Application Ser. No. 61/637,804, filed Apr. 24, 2012, which is herein incorporated by reference.

BACKGROUND OF THE INVENTION

1. Field of the Invention

Embodiments of the present invention generally relate to a doped aluminum nitride hardmask and a method of making a doped aluminum nitride hardmask.

2. Description of the Related Art

As semiconductor devices continue to shrink in size, the precision needed to form such small devices increases. It has become increasingly more difficult to not only shrink the size of the semiconductor chip, but additionally, the individual features that form the electrical interconnects.

There are numerous processes that are performed to fabricate a semiconductor chip. Patterning is one of those processes. In a patterning process, a mask, such as a hardmask, is formed over one or more layers to be patterned. Thereafter, utilizing the hardmask, the underlying layer or layers are exposed to an etchant so that exposed material (i.e., material not covered by the hardmask or photomask) is removed and the pattern of the hardmask is transferred to the underlying layer or layers.

In the ideal etching process, the exposed material is etched while the hardmask is not etched. In other words, the hardmask is ideally inert to the etchant, which may take the form of either a liquid etchant of a gaseous etchant. If the hardmask is inert to the etchant, then the features of the hardmask may transfer to the underlying layer or layers quite well.

Naturally, a chemically inert hardmask is not practical to manufacture. Therefore, some etching of the hardmask is expected. As the hardmask is etched, the precision of the pattern transfer is compromised.

Therefore, there is a need in the art for a hardmask that is more chemically inert to the etching process utilized to transfer the pattern from the hardmask to the underlying layer.

SUMMARY OF THE INVENTION

The present invention generally relates to a doped aluminum nitride hardmask and a method of making a doped aluminum nitride hardmask. By adding a small amount of dopant, such as oxygen, when forming the aluminum nitride hardmask, the wet etch rate of the hardmask can be significantly reduced. Additionally, due to the presence of the dopant, the grain size of the hardmask is reduced compared to a non-doped aluminum nitride hardmask. The reduced grain size leads to smoother features in the hardmask which leads to more precise etching of the underlying layer when utilizing the hardmask.

In one embodiment, a hardmask comprises aluminum nitride and a dopant. In another embodiment, a method of making a hardmask comprises sputtering an aluminum target in an atmosphere containing an inert gas, a nitrogen containing gas, and an oxygen containing gas to form an oxygen doped aluminum nitride material, wherein the amount of nitrogen containing gas is more than two times the amount of oxygen containing gas. The method additionally comprises patterning the oxygen doped aluminum nitride material to form the hardmask.

In another embodiment, a method of making a hardmask comprises sputtering an aluminum nitride target in an atmosphere containing an inert gas, a nitrogen containing gas, and an oxygen containing gas to form an oxygen doped aluminum nitride material, wherein the amount of nitrogen containing gas is more than two times the amount of oxygen containing gas. The method additionally comprises patterning the oxygen doped aluminum nitride material to form the hardmask.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to a doped aluminum nitride hardmask and a method of making a doped aluminum nitride hardmask. By adding a small amount of dopant, such as oxygen, when forming the aluminum nitride hardmask, the wet etch rate of the hardmask can be significantly reduced. Additionally, due to the presence of the dopant, the grain size of the hardmask is reduced compared to a non-doped aluminum nitride hardmask. The reduced grain size leads to smoother features in the hardmask which leads to more precise etching of the underlying layer when utilizing the hardmask.

Figure 1:
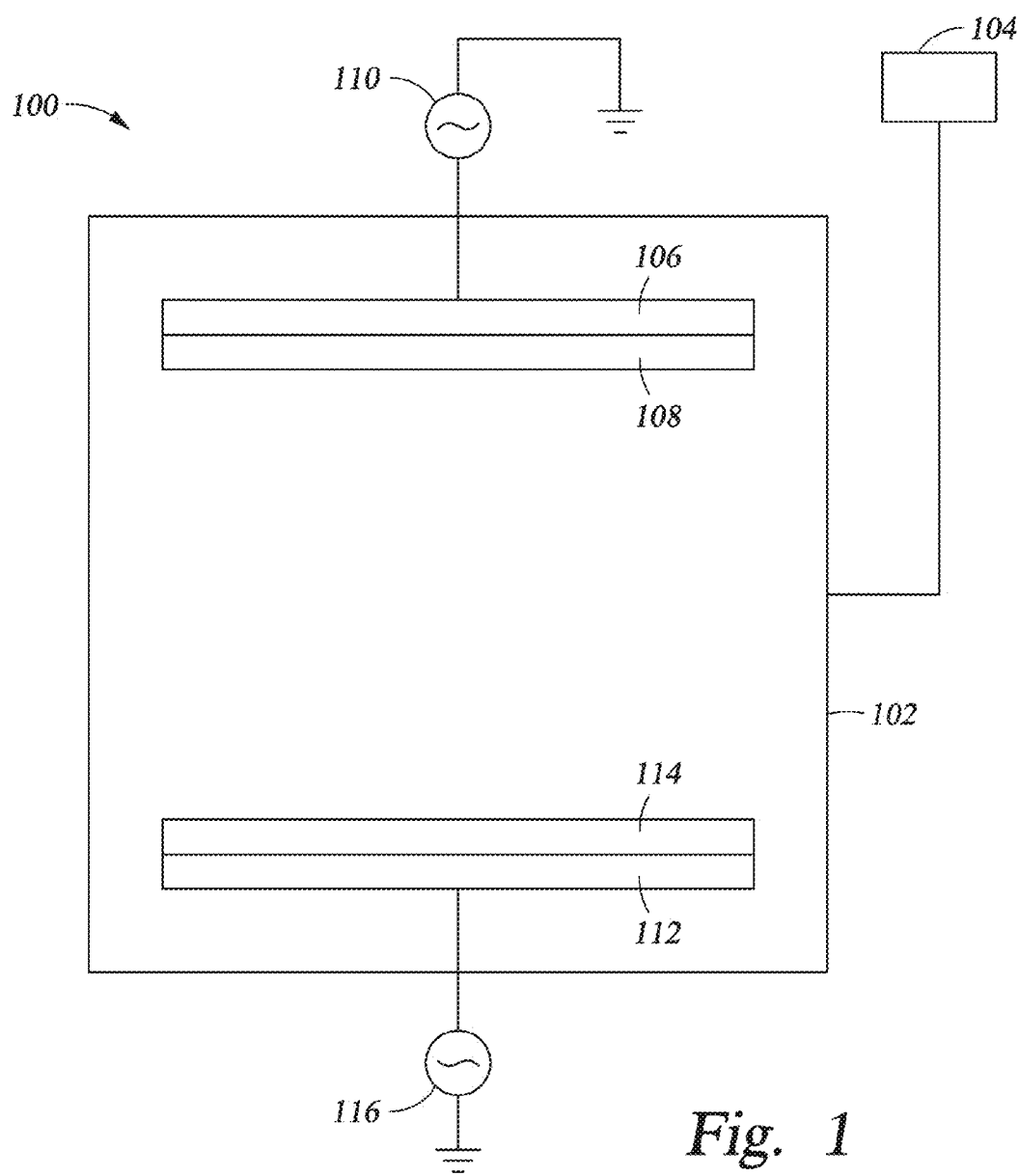
FIG. 1 is a schematic cross sectional illustration of a physical vapor deposition (PVD) apparatus according to one embodiment.

FIG. 1 is a schematic cross sectional illustration of a PVD apparatus 100 according to one embodiment. The apparatus 100 includes a chamber body 102. Gas is delivered to the chamber body 102 from a gas source 104. A sputtering target 108 is disposed within the chamber body 102 opposite a substrate 114. The sputtering target 108 is bonded to a backing plate 106. A bias is applied to the backing plate 106 from a power source 110. The substrate 114 is disposed on a substrate support 112. The substrate support 112 may be biased by a power supply 116. It is to be understood that the substrate support 112 may be electrically floating or directly coupled to ground. The power source 110 may comprise a DC power source, a pulsed DC power source, an AC power source or an RF power source. The backing plate 106 is electrically conductive.

As discussed above, the embodiments disclosed herein relate to a hardmask and a method of forming the hardmask.

Figure 2:
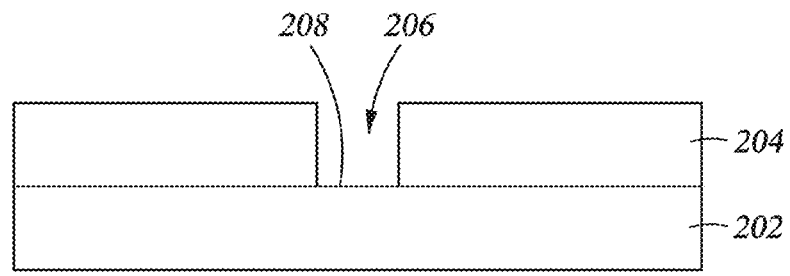
FIG. 2 is a schematic cross-sectional illustration of a hardmask formed over a layer.

FIG. 2 is a schematic cross-sectional illustration of a hardmask 204 formed over a layer 202. The hardmask 204 has been patterned such that a feature 206 is formed therein to expose a portion 208 of the layer 202. In one embodiment, the layer 202 may comprise tungsten. In another embodiment, the layer 202 may comprise polysilicon. The hardmask 204 comprises doped aluminum nitride. The dopant may comprise one or more dopants selected from the group consisting of oxygen, silicon, fluorine, carbon, and combinations thereof. The hardmask 204 may comprise dopant in an amount of up to 25 atomic percent.

The dopant has several benefits. When the dopant is oxygen, the oxygen can control the stress of the hardmask 204. In the absence of oxygen as a dopant, the undoped aluminum nitride hardmask would have a tensile stress of about 400 MPa. However, the oxygen can significantly reduce the stress to a very low tensile stress or even compressive stress. In one embodiment, the stress level is about 0 such that substantially no stress is within the hardmask 204. The stress of the hardmask 204 compensates for the residual stress of all underlying layers. Thus, the stress of the hardmask 204 may be tuned to compensate for the stress of the structure over which the hardmask 204 is disposed.

Additionally, the oxygen dopant reduces the grain size of the resulting hardmask 204. Specifically, the grain size of an oxygen doped aluminum nitride hardmask has a smaller grain size as compared to an undoped aluminum nitride hardmask. An undoped aluminum nitride hardmask has a [0002] peak when measured by XRD analysis. However, an oxygen doped aluminum nitride hardmask, while still having an [0002] peak, has a [0002] peak that is about 1/10 the height of the undoped aluminum nitride hardmask [0002] peak. Additionally, the density of oxygen doped aluminum nitride hardmask is less than the density of the undoped aluminum nitride hardmask.

Due to the presence of the oxygen dopant, the resulting hardmask has smaller grain sizes (as compared to an undoped aluminum nitride hardmask), which leads to smoother features 206, which thus leads to sharper and straighter etching of the underlying layer 202 during a patterning process to etch the underlying layer 202. Additionally, the oxygen doped aluminum nitride hardmask has a much slower etching rate as compared to undoped aluminum nitride hardmasks. Specifically, the oxygen doped aluminum nitride hardmask has a wet etch rate that is about 4 Angstroms per minute in a diluted HF solution (100:1) while an undoped aluminum nitride hardmask has a wet etch rate of about 18 Angstroms per minute. In one embodiment, the Thus, as discussed above, while a completely inert hardmask is not formed by adding a dopant such as oxygen, a much more etch resistant hardmask is formed by utilizing a dopant such as oxygen. Due to the more etch resistant hardmask, the oxygen doped aluminum nitride hardmask maintains its structure (better than an undoped aluminum nitride hardmask) during the etching process and thus leads to better defined features in the underlying layer 202.

In forming the oxygen doped aluminum nitride hardmask, such a small amount of oxygen is utilized that little to no aluminum-oxygen bonds are formed. The hardmask 204 may be formed by providing an aluminum target 108 opposite the substrate 114 that contains the layer 202 thereover. An inert gas, a nitrogen containing gas, and an oxygen containing gas are all introduced to the chamber body 102 from a gas source 104. An electrical bias is applied to the backing plate 106 from a power source 110 while the substrate 114 is electrically grounded on the substrate support 112. The power source 110 applies a DC electrical bias to the sputtering target 108 to generate a plasma within the chamber body and eject aluminum atoms from the target 108. The aluminum atoms react with the nitrogen to form aluminum nitride. The oxygen does not react with the aluminum and thus dopes the aluminum nitride layer formed on the substrate 114. In one embodiment, the target 108 may comprise aluminum nitride while the power source 110 comprises an RF power source. In one embodiment, the sputtering target may operate in a poisoned mode whereby the target comprises aluminum, but an aluminum nitride film is formed on the exposed surface of the target. Thus, at the beginning of the sputtering process, aluminum nitride is sputtered from the sputtering target.

In one embodiment, the nitrogen containing gas comprises $N_2$ and the oxygen containing gas comprises $O_2$. The inert gas may comprise argon. The ratio of the inert gas to the nitrogen containing gas may be between about 1:1 to about 1:20. In one embodiment, the ratio of inert gas to nitrogen containing gas may be about 1:5. The ratio of nitrogen containing gas to oxygen containing gas is more than 2:1 and may be between about 100:1 to about 20:1. In one embodiment, the ratio of nitrogen containing gas to oxygen containing gas may be about 50:3.

Figure 3A:
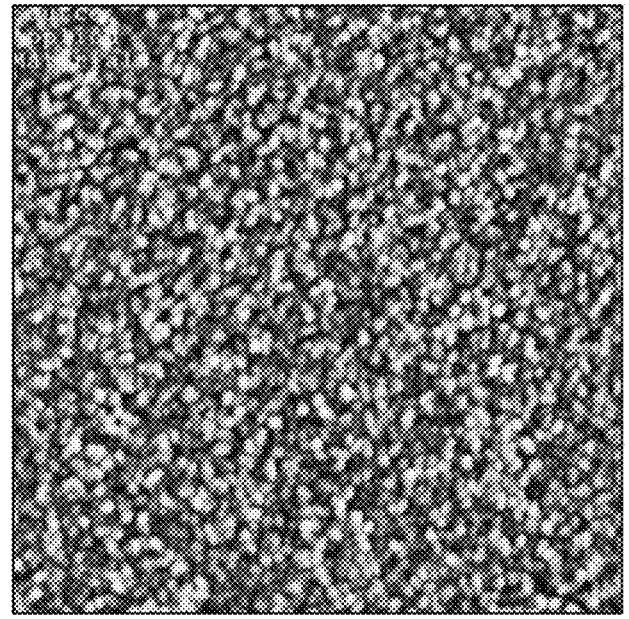
FIGS. 3A and 3B show the grain structure for an undoped aluminum nitride film and an oxygen doped aluminum nitride film respectively.
Figure 3B:
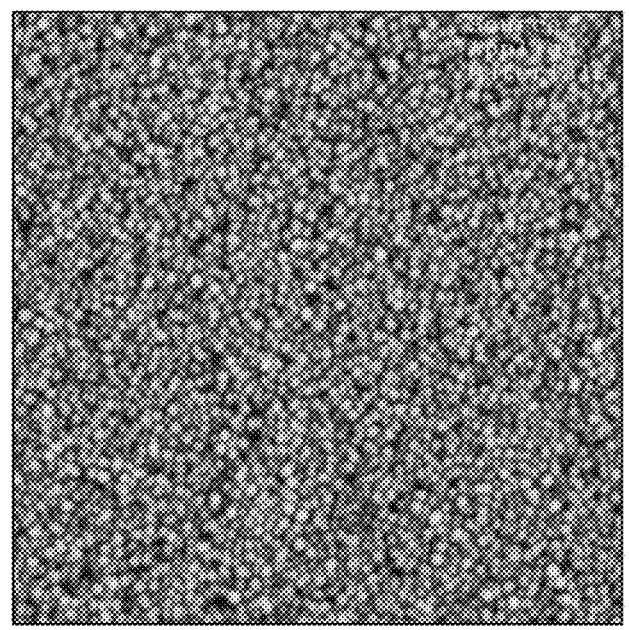

Once deposited, the oxygen doped hardmask may have an oxygen content of up to about 25 atomic percent. In one embodiment, the oxygen content may be up to about 10 atomic percent. The chamber body 102 may be maintained at a chamber pressure of between about 1 mTorr and about 100 mTorr and a substrate support 112 temperature of between about 25 degrees Celsius and about 500 degrees Celsius. A power of between about 1 kW and about 20 kW may be supplied to the sputtering target 108 from power source 110. The resulting doped aluminum nitride hardmask is polycrystalline. FIGS. 3A and 3B show the grain structure for an undoped aluminum nitride film and an oxygen doped aluminum nitride film respectively. As shown in FIG. 3B, the grain size is significantly reduced.

By utilizing a dopant, such as oxygen, an aluminum nitride hardmask may be fabricated that has a slower etch rate as compared to an undoped aluminum nitride hardmask. Additionally, the doped aluminum nitride hardmask has a smaller grain size and thus, a smoother surface when patterned. Therefore, the doped aluminum nitride hardmask, while not chemically inert, may permit finer, more detailed features to be formed in layers thereunder during a patterning process.

While the foregoing is directed to embodiments of the present invention, other and further embodiments of the invention may be devised without departing from the basic scope thereof, and the scope thereof is determined by the claims that follow.

The invention claimed is:

1. A method of making a hardmask, comprising:
   sputtering an aluminum target in an atmosphere containing an inert gas, a nitrogen containing gas, and an oxygen containing gas to deposit an oxygen doped polycrystalline aluminum nitride material, wherein the amount of nitrogen containing gas is more than two times the amount of oxygen containing gas; and
   patterning the oxygen doped polycrystalline aluminum nitride material to form the hardmask.

2. The method of claim 1, wherein the nitrogen containing gas comprises $N_2$.

3. The method of claim 2, wherein the oxygen containing gas comprises $O_2$.

4. The method of claim 3, wherein the ratio of inert gas to $N_2$ is between about 1:1 to about 1:20.

5. The method of claim 4, wherein the ratio of inert gas to $N_2$ is about 1:5.

6. The method of claim 5, wherein the ratio of $N_2$ to $O_2$ is between about 100:1 to about 20:1.

7. The method of claim 6, wherein the ratio of $N_2$ to $O_2$ is about 50:3.

8. The method of claim 1, wherein sputtering occurs at a temperature between about 25 degrees Celsius and about 500 degrees Celsius.

9. The method of claim 8, wherein the sputtering occurs at a chamber pressure of between about 1 mTorr and about 100 mTorr.

10. The method of claim 1, wherein the sputtering is DC sputtering or pulsed DC sputtering.

11. A method of making a hardmask, comprising:
   sputtering an aluminum nitride target in an atmosphere containing an inert gas, a nitrogen containing gas, and an oxygen containing gas to form an oxygen doped polycrystalline aluminum nitride material, wherein the amount of nitrogen containing gas is more than two times the amount of oxygen containing gas; and
   patterning the oxygen doped polycrystalline aluminum nitride material to form the hardmask.

12. The method of claim 11, wherein the sputtering is RF sputtering.

* * * * *